United States Patent
Tsuchiya et al.

(10) Patent No.: US 6,211,965 B1
(45) Date of Patent: Apr. 3, 2001

(54) PHOTOLITHOGRAPHIC POSITION MEASURING LASER INTERFEROMETER WITH RELITIVELY MOVING MEASURING INTEREOMETER

(75) Inventors: Makoto Tsuchiya, Kawasaki; Junji Hazama, Yokohama, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/377,181

(22) Filed: Aug. 19, 1999

(30) Foreign Application Priority Data

Aug. 20, 1998 (JP) .................................................. 10-233894
Aug. 18, 1999 (JP) .................................................. 11-231054

(51) Int. Cl.$^7$ ...................................................... G01B 9/02
(52) U.S. Cl. .......................... 356/493; 356/487; 356/500; 356/509
(58) Field of Search .................................. 356/486, 487, 356/493, 498, 500, 509, 490, 492

(56) References Cited

U.S. PATENT DOCUMENTS 3,622,244 * 11/1971 Chitayat ................................ 356/500
5,715,037    2/1998 Saiki et al. .
5,729,331    3/1998 Tanaka et al. .
5,767,971    6/1998 Kawai et al. .

* cited by examiner

Primary Examiner—Samuel A. Turner
(74) Attorney, Agent, or Firm—Oliff & Berridge, PLC

(57) ABSTRACT

A laser interferometer for detecting the position of a moving object in a Y-direction when the object moves in an X-direction has a separating optical system that moves in the X-direction at a speed different from that of the moving object. A laser beam is separated by the separating optical system into a reference beam and a measurement beam, which are individually directed toward a reference mirror and a moving mirror on the moving object. The light of the measurement beam reflected from the moving mirror, and the light of the reference beam reflected from the reference mirror are received by a photodetector via the separating optical system, and the photoelectric conversion signal of the interference light is output as information concerning the position of the moving object in the Y-direction. A fixed mirror that is shorter than the moving object can be used because the separating optical system also moves in the X-direction.

57 Claims, 8 Drawing Sheets

PHOTOLITHOGRAPHIC POSITION MEASURING LASER INTERFEROMETER WITH RELITIVELY MOVING MEASURING INTEREOMETER

BACKGROUND OF THE INVENTION

1. Field of the Invention

The present invention relates to a laser interferometer, a position measuring apparatus, and an exposure apparatus, and more particularly to a laser interferometer and a position measuring apparatus for superposing a measurement beam reflected from a moving mirror and a reference beam reflected from a reference mirror, and measuring the position of a moving object, and to an exposure apparatus in which this interferometer or position measuring apparatus is provided as a position measuring apparatus for at least one of a mask stage and a substrate stage. The present invention also relates to a position measuring method and to a method for manufacturing a laser interferometer, a position measuring apparatus, and an exposure apparatus. The laser interferometer and position measuring apparatus pertaining to the present invention are particularly suitable for use as scanning exposure apparatus in the manufacture of liquid-crystal display panels, plasma display panels, and other display elements.

2. Description of the Related Art

Scanning exposure apparatus capable of exposing large surface areas in a single sweep are currently used on a comparatively large scale to accommodate increased dimensions of liquid-crystal substrates used in lithographic processes for manufacturing liquid-crystal display panels or the like. As disclosed, for example, in U.S. Pat. No. 5,729,331 corresponding to Japanese Patent laid-open No. 07-57986, known scanning exposure apparatus for such liquid crystal applications are configured such that a projection optical system is constructed using a plurality of same-size, erect projection optical units composed of two partial optical systems each of which contains a refraction system and a concave reflecting mirror, and a mask and a plate (substrate) are moved as a unitary structure relative to the projection optical system to achieve single-scan exposure.

An increase in the size of a liquid-crystal substrate makes it necessary to increase the scanning distance for the mask stages and substrate stages in a scanning exposure apparatus used in liquid crystal applications. Consequently, reflecting mirrors in which the length of the reflecting surfaces in the scanning direction exceeds the length of the stages in the scanning direction must be provided as moving mirrors or fixed mirrors in order to achieve high accuracy when measuring the positions of mask and substrate stages in a non-scanning direction by a laser interferometer. A scanning exposure apparatus equipped with a fixed mirror that extends a considerable distance in the scanning direction is disclosed, for example, in Japanese Patent Laid-open No. 10-74692. Disclosed in this publication is a double-pass laser interferometer for measuring the position of a stage in a non-scanning direction, wherein a beam splitter (for dividing laser light into a reference beam and a measurement beam), a mirror, a corner cube, and the like are fixed to a stage, and a fixed mirror consisting of a plane mirror that is longer than the stage is used as a reference mirror.

Recently, however, liquid-crystal substrates have grown in size even further, gradually making it more difficult to use the technique described in Japanese Patent Laid-open No. 10-74692 without further modifications and to measure the position of a stage in a non-scanning direction with high accuracy. This is attributed to the fact that stages have recently grown in size to match the increased size of substrates, so the aforementioned fixed mirrors have become longer, making it more difficult to process and polish reflecting surfaces thereof with sufficient accuracy.

Liquid-crystal substrates and the like will undoubtedly continue to increase in size in the future, and an urgent need therefore exists to develop a novel technique capable of accommodating this trend.

SUMMARY OF THE INVENTION

The first object of the present invention, which was achieved in order to overcome the drawbacks of prior art, is to provide a laser interferometer and a position measuring apparatus capable of measuring the position of a moving object in a direction orthogonal to the long stroke direction across the entire region of a movement stroke in excess of the total length of the moving object, using a reflecting mirror that is shorter than the total length of the moving object; and to provide a method for manufacturing these.

It is a second object of the present invention to provide an exposure apparatus capable of controlling the position of a mask stage or a substrate stage with high accuracy even when the substrate is bulky, and to provide a method for manufacturing this apparatus.

It is a third object of the present invention to provide a position measuring method capable of measuring the position of a moving object in a direction orthogonal to the long stroke direction across the entire region of a movement stroke in excess of the total length of the moving object, using a reflecting mirror that is shorter than the total length of the moving object.

According to a first aspect of the present invention, there is provided a laser interferometer for measuring by means of a laser beam a position of a moving object in a first direction (Y-axis direction) orthogonal to a second direction (X-axis direction) when the object moves in the second direction, this laser interferometer comprising:

a separating optical system (21 or 21') for separating the laser beam into a measurement beam and a reference beam;

a moving mirror (22 or 22') which is attached to the moving object (4 or 5) and reflects the measurement beam;

a reference mirror (26 or 26') which is provided independently from the moving object and reflects the reference beam;

a moving device (6 or 6') for moving the separating optical system in the second direction at a speed different from the speed of the moving object; and a detector for detecting the measurement beam reflected from the moving mirror and the reference beam reflected from the reference mirror, and determining the position of the moving object in the first direction on the basis of the interference effect of these beams.

The laser beam emitted by a light source is thus separated into a reference beam and a measurement beam by a separating optical system. The measurement beam is reflected from the reflecting surface of a moving mirror provided to the moving object, and the reference beam is reflected from the reference mirror. The position of the moving object with respect to the first direction is measured based on a photoelectric conversion signal of interference light, which is composed of the light of the measurement beam reflected from the moving mirror and the light of the reference beam reflected from the reference mirror.

The above-described measurements are performed during the movement of a moving object, but because the separating optical system moves in the second direction with a different speed than does the moving object, the measurement beam separated by the separating optical system continuously strikes a different position on the reflecting surface of the moving mirror, and the position of the moving object in the first direction can be measured as long as the following expression is satisfied: $S=|V1/(V1-V2)|L1>L1$, or $0<V2<2V1$ ($V1 \neq V2$), where L1 is the length of the moving mirror in a second direction (long stroke direction) orthogonal to the first direction, which is the measuring direction of the object; V1 is the speed of the moving object in the second direction; V2 is the speed of the separating optical system in the second direction; and S is the movement stroke of the moving object in the second direction. It is therefore possible to measure the position of a moving object (measurement object) in a direction orthogonal to the long stroke direction across the entire region of a movement stroke in excess of the total length of the moving object, using a reflecting mirror that is shorter than the total length of the moving object.

Here, laser interferometers are known to yield much more accurate position measurements than do other measuring apparatus, and, in particular, make it possible to achieve particularly accurate position detecting in heterodyne detection systems.

According to a second aspect of the present invention, there is provided a position measuring apparatus for measuring by means of light from a light source the position of a moving object in a first direction orthogonal to a second direction when the object moves in the second direction, this position measuring apparatus comprising:

a separating optical system for separating the light from the light source into a measurement beam and a reference beam;

a moving mirror which is attached to the moving object and reflects the measurement beam;

a fixed mirror which is provided independently from the moving object and defines part of an optical path for the measurement beam between the moving mirror and the fixed mirror;

a moving device for moving the separating optical system in the second direction at a speed different from the speed of the moving object; and a detecting system for detecting the measurement beam and the reference beam and determining the position of the moving object in the first direction on the basis of the interference effect of these beams.

In the position measuring apparatus of the present invention, the length of the optical path between the moving mirror and the fixed mirror can be measured by the measurement beam. Because the movement of the moving object is accompanied by the movement of the separating optical system, the irradiation point on the moving mirror and the irradiation point on the fixed mirror irradiated by the measurement beam move as well. The fixed mirror can be made shorter than the moving object in the direction of travel by adjusting the travel speed of the separating optical system. Placing the separating optical system at a position inside the optical path between the moving mirror and the fixed mirror allows the measurement beam to yield information relating to the length and length variations of the optical path between the moving mirror and the fixed mirror irrespective of the route for the movement of the separating optical system. A reference mirror for reflecting the reference beam toward the aforementioned detecting system may be provided. This reference mirror may be disposed facing the detecting system such that the aforementioned separating optical system is sandwiched therebetween, and the moving device may be such that, for example, a reference mirror is mounted on a moving stage. The fixed mirror may be disposed facing the moving mirror such that the separating optical system is sandwiched therebetween.

According to a third aspect of the present invention, there is provided an exposure apparatus for transferring a pattern formed on a mask to a substrate, this exposure apparatus comprising:

a mask stage for holding the mask and moving it in a second direction;

a substrate stage for holding the substrate and moving it in the second direction; and a laser interferometer for measuring by means of a laser beam the position of at least one of the stages in a first direction orthogonal to the second direction; the laser interferometer including:

a separating optical system for separating the laser beam into a measurement beam and a reference beam;

a moving mirror which is attached to at least one of the aforementioned stages and reflects the measurement beam;

a reference mirror which is provided independently from at least one of the aforementioned stages and reflects the reference beam;

a moving device for moving the separating optical system in the second direction at a speed different from the speed of the at least one of the aforementioned stages; and a detector for detecting the measurement beam reflected from the moving mirror and the reference beam reflected from the reference mirror, and determining the position of the at least one of the aforementioned stages in the first direction on the basis of the interference effect of these beams.

According to a fourth aspect of the present invention, there is provided an exposure apparatus for transferring a pattern formed on a mask to a substrate, this exposure apparatus comprising:

a mask stage for holding the mask and moving it in a second direction;

a substrate stage for holding the substrate and moving it in the second direction; and a position measuring apparatus for measuring by means of a light beam the position of at least one stage in a first direction orthogonal to the second direction, the position measuring apparatus comprising:

a separating optical system for separating the light beam into a measurement beam and a reference beam;

a moving mirror which is attached to the at least one of the aforementioned stages and reflects the measurement beam;

a fixed mirror which is provided independently from at least one of the aforementioned stages and defines part of an optical path for the measurement beam between the moving mirror and the fixed mirror;

a moving device for moving the separating optical system in the second direction at a speed different from the speed of at least one of the aforementioned stages; and a detecting system for detecting the measurement beam and the reference beam and determining the position of at least one of the aforementioned stages in the first direction on the basis of the interference effect of the beams.

The exposure apparatus according to the third and fourth aspects of the present invention can sense with high accuracy the position of a mask stage or substrate stage in a direction orthogonal to the long stroke direction of this stage across the entire region of a movement stroke in excess of the total length of the stage, using a reflecting mirror that is shorter than the total length of the mask stage or substrate stage. In this case, the position of the aforementioned stage in the long stroke direction can be measured with high accuracy by an interferometer having a length-measuring beam in the long stroke direction in the same manner as in the past. It is therefore possible to control the position of a stage with high accuracy and to ultimately achieve highly accurate superposition of masks and substrates even when the substrates are bulky. It is also possible to miniaturize the exposure apparatus and to reduce manufacturing costs.

According to a fifth aspect of the present invention, there is provided a position measuring method for measuring a position of a moving object in a first direction orthogonal to a second direction based on interference effect by directing a laser beam toward a fixed mirror and a moving mirror attached to the moving object, which travels in the second direction, this method comprising the steps of:

separating the laser beam into a measurement beam and a reference beam;

directing the measurement beam toward the moving mirror while moving the measurement beam in the second direction at a speed different from that of the moving object being moved, and passing the light reflected from the moving mirror between the moving mirror and the fixed mirror; and determining the position of the moving object in the first direction by comparing the phase of the reference beam and the phase of the measurement beam passed between the moving mirror and the fixed mirror.

According to the position measuring method of the present invention, the length of the moving mirror and the fixed mirror can be used efficiently, and the position of a moving object measured, by moving the measurement beam in the second direction at a speed different from that of the moving mirror (for example, by moving the beam at half the speed of the moving mirror). The length of the fixed mirror illuminated with a reference beam can thus be made less than the length of the moving object in the second direction. The method of the present invention is therefore very useful when a fixed mirror (or a moving mirror) must be processed with high accuracy or when no mounting space is allocated for these mirrors.

According to a sixth aspect of the present invention, there is provided a method for manufacturing the laser interferometer according to the first aspect of the present invention.

According to a seventh aspect of the present invention, there is provided a method for manufacturing the position measuring apparatus according to the second aspect of the present invention.

According to an eighth aspect of the present invention, there is provided a method for manufacturing the exposure apparatus according to the third aspect of the present invention.

According to a ninth aspect of the present invention, there is provided a method for manufacturing the exposure apparatus according to the fourth aspect of the present invention.

According to a tenth aspect of the present invention, there is provided a position measuring apparatus for measuring by means of a light beam from a light source the position of a moving object in a first direction orthogonal to a second direction when the object moves in the second direction, this position measuring apparatus comprising:

a moving mirror attached to the moving object, and a fixed mirror provided independently from the moving object;

an optical system for splitting the light beam from the light source and directing the split beams individually toward the moving mirror and the fixed mirror;

a moving device for moving the optical system in the second direction at a speed different from the speed of the moving object; and a detector for detecting the light beams reflected from the moving mirror and the fixed mirror, and determining the position of the moving object in the first direction on the basis of the interference effect of these beams.

The position measuring apparatus in accordance with the tenth aspect of the present invention is typified by the apparatus shown, for example, in FIGS. 7 or 8. In this position measuring apparatus, the optical system is caused by a moving device to move slower than the moving object, making it possible to make the fixed mirror shorter than the moving object in the second direction.

DESCRIPTION OF THE PREFERRED EMBODIMENTS

First Embodiment

A first embodiment will be described below with reference to FIGS. 1–4.

Figure 1:
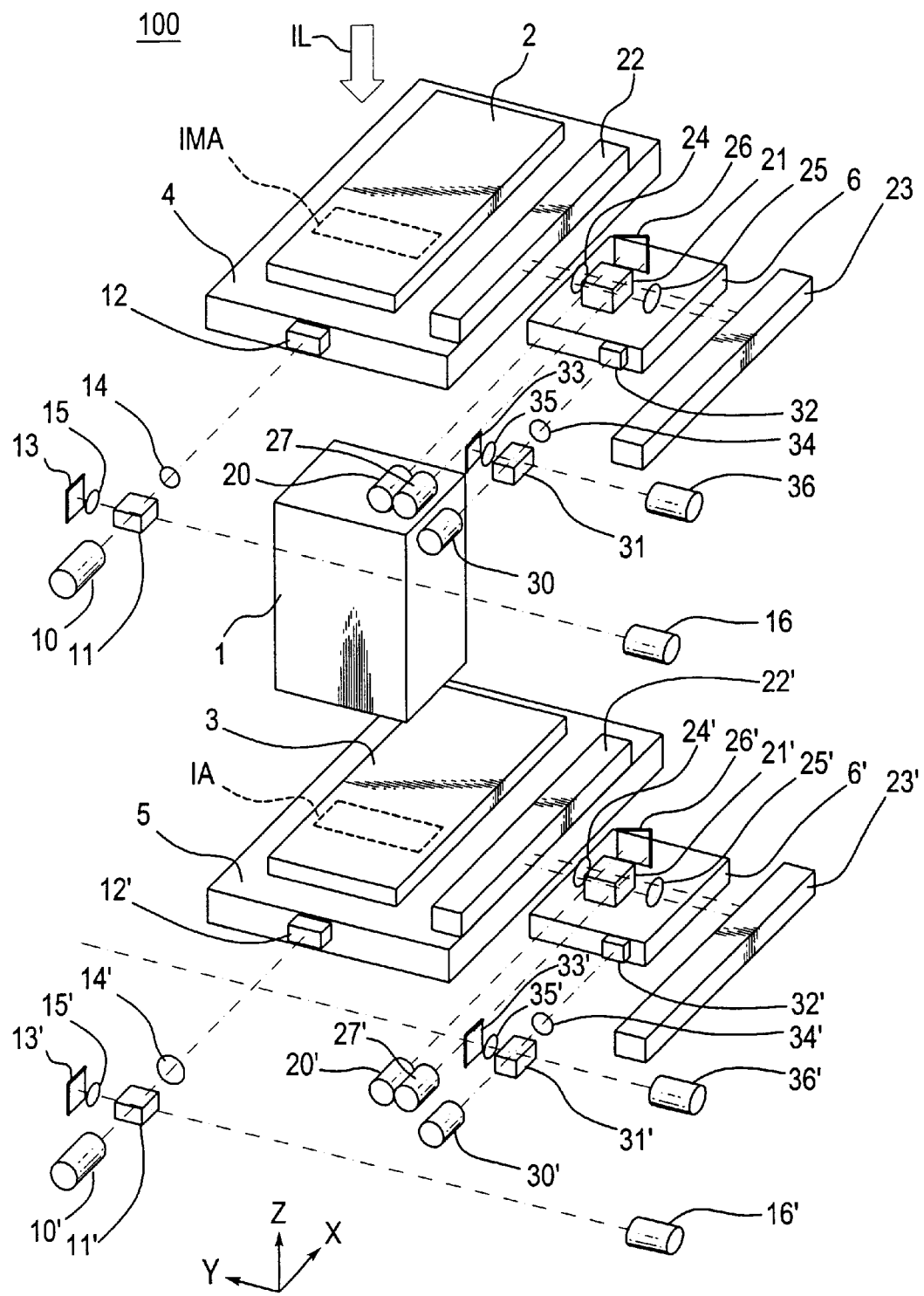
FIG. 1 is a diagram schematically showing the structure of the main portion of the scanning exposure apparatus pertaining to a first embodiment.

FIG. 1 depicts the structure of the main portion of the exposure apparatus 100 pertaining to the first embodiment, in which the laser interferometer according to the present invention is provided as an apparatus for measuring the position of a mask stage 4 and a plate stage 5 as moving objects in a prescribed first direction (Y-axis direction). The exposure apparatus 100 is a scanning exposure apparatus used in the manufacture of liquid-crystal display panels and designed to transfer patterns formed on a mask 2 to a plate 3 in a single sweep by scanning the mask 2 and the plate 3

(substrate) relative to a projection optical system 1. This type of scanning exposure apparatus is disclosed, for example, in U.S. Pat. No. 5,715,037, the content of which is incorporated herein by reference. In the explanation that will be described hereafter, the optical axis direction of the projection optical system 1 is designated as a Z-axis direction, the scanning direction in which the mask 2 and the plate 3 are scanned relative to the projection optical system within a plane orthogonal to the Z-axis is designated as an X-axis direction (second direction), and the non-scanning direction orthogonal to the X-axis direction is designated as an Y-axis direction (aforementioned first direction).

The exposure apparatus 100 comprises an irradiation optical system (not shown) for uniformly irradiating an irradiation area IMA in the form of a rectangular slit on the mask 2 with exposure/irradiation light IL, a mask stage 4 for holding the mask 2 underneath the irradiation optical system, a projection optical system 1 disposed underneath the mask stage 4, a plate stage 5 (substrate stage) for holding the plate 3 underneath the projection optical system 1, and the like.

Here, a device for projecting a same-size, normal, erect image is used as the projection optical system 1. Consequently, irradiating the irradiation area IMA on the mask 2 with the exposure/irradiation light IL from the irradiation optical system will project a same-size image (partial erect image) of the circuit pattern over the irradiation area IMA onto an exposure area IA conjugate to the irradiation area IMA on the plate 3. The projection optical system 1 may be composed of a plurality of same-size erect optical units, as described, for example, in Japanese Patent Application Laid Open No. 7-57986. The content of Japanese Patent Application Laid Open No. 7-57986 and the corresponding U.S. Pat. No. 5,729,331 is incorporated herein by reference.

The mask stage 4 and the plate stage 5 are mounted on a carriage (now shown) that has a U-shape in cross section. Specially, the mask stage 4 is mounted in actual practice on the top plate portion of the aforementioned carriage and is configured such that it can be driven over minute distances within the XY plane by a motor (not shown) or other drive apparatus. A mask 2 is horizontally held by vacuum suction or the like on the mask stage 4. The XY position of the mask stage 4 is measured by a mask-side interferometer system for the mask 2 (mask-side interferometer system) with a prescribed resolution (for example, with a resolution of about 0.5–1 nm). The mask-side interferometer system will be described in detail hereinbelow.

In addition, the plate stage 5 is mounted in actual practice on the bottom plate portion of the aforementioned carriage and is configured such that it can be driven over minute distances within the XY plane by a motor (not shown) or other drive apparatus. A plate 3 whose surface is coated with a photoresist (photosensitive material) is horizontally held by vacuum suction or the like on the plate stage 5. The XY position of the plate stage 5 is measured by an interferometer system for the plate 5 (plate-side interferometer system) with a prescribed resolution (for example, with a resolution of about 0.5–1 nm). Either one of the mask stage 4 and the plate stage 5 may be fixed on top of the carriage.

In the exposure apparatus 100, the mask stage 4 and the plate stage 5 are integrally scanned relative to the projection optical system 1 by the driving of the carriage in the X-axis direction, whereby an image of the circuit formed over the entire area of a patterned region on the mask 2 is transferred to the plate 3 whose surface is coated with the photoresist.

Figure 2:
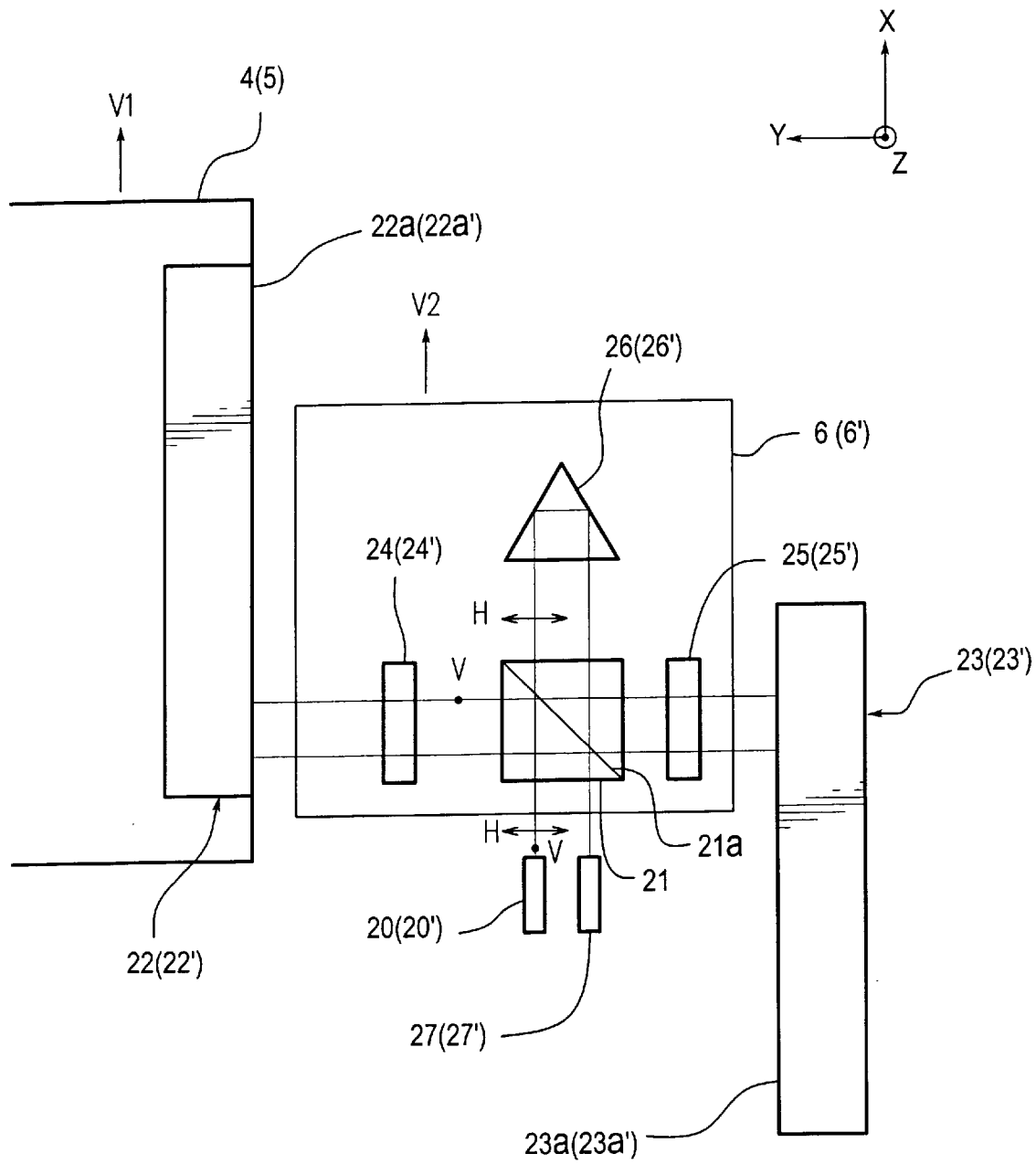
FIG. 2 is a plan view depicting the components that constitute the structure of an Y-interferometer for measuring the position of the mask stage and plate stage in the non-scanning direction in FIG. 1.

The mask-side interferometer system will now be described with reference to FIGS. 1 and 2. Since the plate-side interferometer system has the same configuration as the mask-side interferometer system, corresponding components in FIGS. 1 and 2 are distinguished from each other by being designated with identical symbols suffixed with primes, and a detailed description of these components will be omitted.

The mask-side interferometer system comprises an X-interferometer for measuring the position of the moving object in the X-axis direction, which is the scanning direction of the mask stage 4, and an Y-interferometer for measuring the position in the Y-axis direction, which is a non-scanning direction. Michelson-Morley heterodyne laser interferometers, which are widely used in actual practice, may be employed as such X- and Y-interferometers. Such interferometers are disclosed, for example, in U.S. Pat. No. 5,767,971, the content of which is incorporated herein by reference.

The X-interferometer comprises a laser head 10, a polarizing beam splitter 11, a moving mirror 12, a fixed mirror 13, quarter-wave plates (hereinafter referred to as "¼λ plates") 14 and 15, a receiver 16, and other components shown in FIG. 1.

A light source and a detector unit are disposed inside the laser head 10. A two-frequency laser whose operation is based on the Zeeman effect may be used as the light source. In this light source, the frequency is stabilized, the Zeeman effect is used to obtain an oscillation frequency (and thus a wavelength) that varies by 2–3 MHz, and the output is a laser light flux composed of normally distributed circular beams containing a first polarized component and a second polarized component with mutually orthogonal polarization directions. The first polarized light component is a polarized light component (also referred to as "p-polarized light") parallel to a light incidence plane with respect to the light separation plane (see 21a in FIG. 2) of the polarizing beam splitter 11, that is, parallel to a plane containing the light incident on the light separation plane and a normal to the light separation plane. This component is referred to hereinbelow as "the H-component." The second polarized light component is a polarized light component (also referred to as "s-polarized light") perpendicular to the light incidence plane with respect to the light separation plane of the polarizing beam splitter 11. This component is referred to hereinbelow as "the V-component."

The detector unit is disposed inside the laser head 10 and is designed to monitor the phase change resulting from the interference between the two oscillation wavelengths that are output by the light source, that is, between the V-component and the H-component, and to send the monitoring signal as a reference signal for the detection of the phase difference to a signal processing system (not shown).

The polarizing beam splitter 11 is an optical element for passing a prescribed polarized light component and reflecting the polarized light component orthogonal thereto. Here, the H-component and the V-component are separated as a result of the fact that the H-component from the laser head 10 is transmitted unchanged, whereas the V-component is reflected.

The moving mirror 12 is a mirror that is fixed to the end face of the mask stage 4 on the side (−X side) of the X-axis direction and that moves together with the mask stage relative to the projection optical system. The fixed mirror 13 is fixed at a prescribed position (for example, to the projection optical system 1) inside the apparatus.

The operation of the components of the X-interferometer will now be described. Laser light emitted by the laser head 10 is directed toward the polarizing beam splitter 11, and the incident laser light is separated into an H-component (measurement beam) and a V-component (reference beam).

The reference beam (V-component) reflected by the beam splitter 11 is transmitted by the ¼ λ plate 15, converted to circularly polarized light, reflected by the fixed mirror 13, and retransmitted by the ¼ λ plate 15 in a reverse direction relative to the initial direction. The polarization direction of the reference beam is thereby converted to a direction (same polarization direction as that of the H-component) orthogonal to the initial direction of incidence of light on the ¼-wave plate 15, and the beam is transmitted by the polarizing beam splitter 11 and directed toward the receiver 16.

Meanwhile, the measurement beam (H-component) transmitted by the beam splitter 11 is transmitted by the ¼ λ plate 14, converted to a circularly polarized light, reflected by the moving mirror 12, and retransmitted by the ¼ plate 14 in a reverse direction relative to the initial direction. The polarization direction of the measurement beam is thereby converted to a direction (same polarization direction as that of the V-component) orthogonal to the direction of incidence of light on the ¼-wave plate 14, reflected by the polarizing beam splitter 11, coaxially superposed with the reference beam, transmitted along the same optical path, and admitted by the receiver 16.

The receiver 16 houses a photoelectric conversion element and a polarizing element (not shown), with the polarizing element being set such that the angle of polarization is 45 degrees in relation to the V-component and H-component (that is, the measurement beam and reference beam) from the polarizing beam splitter 11. The polarizing element is thus allowed to transmit solely the vector constituent of the V-component in the direction of the deflection angle, and solely the vector constituent of the H-component in the direction of the deflection angle. The polarized light of VV, which is the vector constituent of the V-component transmitted by the polarizing element, and VH, which is the vector constituent of the H-component, strikes the photoelectric conversion element. The photoelectric conversion element photoelectrically converts the polarized light of the two vector constituents and feeds the resulting electric signal (interference signal) to the signal processing system (not shown).

The signal processing system receives a reference signal for phase detection from the laser head 10 in the manner described above, performs calculations using this reference signal, and determines the X-position (displacement of the mask stage 2 in the X-axis direction) of the moving mirror 12 with high accuracy. The signal processing system processes signals according to a well-known method pertaining to heterodyne interferometers, so the specifics of such processing will be omitted from the present detailed description.

The Y-interferometer comprises a laser head 20 (light source unit), a polarizing beam splitter 21 (separating optical system), a moving mirror 22, a fixed mirror 23 (reflecting optical member), ¼ λ plates 24 and 25, a corner cube 26 (optical path bending member), a receiver 27, and the like. This Y-interferometer is a laser interferometer according to the present invention and is designed to measure the position of the mask stage 4 as a moving object in the Y-axis direction. FIG. 2 is a plan view of this Y-interferometer.

The laser head 20, the polarizing beam splitter 21, and the receiver 27 are the same as the laser head 10, the polarizing beam splitter 11, and the receiver 16 described above.

The moving mirror 22 extends over first length L1 in the X-axis direction along the end portion of the mask stage 4 in the Y-axis direction (−Y side), and the side surface on the −Y side of the moving mirror 22 is used as a reflecting surface 22a. As is evident in FIG. 2, L1 is less than the length (total length) of the mask stage 4 in the X-axis direction.

In this case, the corner cube 26, which constitutes a reference mirror, is fixed to a beam splitter stage 6 (moving device) to achieve a prescribed positional relation with the polarizing beam splitter 21 and the ¼ λ plates 24 and 25. The beam splitter stage 6 is driven by a linear motor or other drive system (not shown) in the X-axis direction within substantially the same plane as the mask stage 4.

The fixed mirror 23 is fixed at a prescribed position on the other side of the beam splitter stage 6 from the moving mirror 22. The surface of the fixed mirror 23 on the other side of the Y-axis direction (+Y side) is used as a reflecting surface 23a that extends over second distance L2 in the X-axis direction.

The operation of the components of the Y-interferometer will now be described with reference to FIG. 2. Laser light emitted by the laser head 20 is directed toward the polarizing beam splitter 21, and the laser light incident thereon is separated by a light-separating surface 21a into an H-component (reference beam) and a V-component (measurement beam).

The reference beam (H-component; linearly polarized light whose oscillation direction is parallel to the plane of paper in FIG. 2) transmitted by the light-separating surface 21a is transmitted by the polarizing beam splitter 21, reflected by the corner cube 26 (reference mirror), bent back along the optical path (which is parallel to the path of incident light), retransmitted by the polarizing beam splitter 21, and directed toward the receiver 27.

The measurement beam (V-component; linearly polarized light whose oscillation direction is perpendicular to the plane of paper in FIG. 2) reflected by the light-separating surface 21a is transmitted by the ¼ λ plate 24, converted to circularly polarized light, reflected by the reflecting surface 22a of the moving mirror 22, and retransmitted by the ¼ λ plate 24. The polarization direction of the measurement beam is thereby reconverted from circularly polarized light to linearly polarized light, and the polarization direction of the linearly polarized light is converted to a direction (same direction as that of the H-component) orthogonal to the initial direction of incidence of light on the ¼ λ plate 25. The beam is then transmitted by the polarizing beam splitter 21 and the ¼ λ plate 25, and is converted to circularly polarized light. The measurement beam is reflected by the reflecting surface 23a of the fixed mirror 23 and retransmitted by the ¼ λ plate 25. The polarization direction of the measurement beam is thereby converted to a direction (same direction as that of the H-component) opposite the initial direction of incidence of light on the ¼-wave plate 25, and the beam is reflected by the polarizing beam splitter 21 and directed toward the corner cube 26, as described above. The measurement beam is bent back by the corner cube 26 along an optical path parallel to the path of incident light, reflected again by the polarizing beam splitter 21, transmitted by the ¼ λ plate 25, and reflected by the reflecting surface 23a of the fixed mirror 23. The measurement beam is retransmitted by the ¼ λ plate 25, and the polarization direction is reversed to the same direction as that of the H-component. The beam is transmitted by the polarizing beam splitter 21, passed through the ¼ λ plate 24, reflected by the moving mirror 22, and transmitted by the ¼ λ plate 24, whereupon the polarization direction thereof is reconverted (to the same direction as that of the V-component). The beam is subsequently reflected by the polarizing beam splitter 21, coaxially superposed with the reference beam, transmitted along the same optical path, and admitted by the receiver 27.

In the receiver 27, as in the receiver 16, the interference light of the vector constituents of the two components is presented to a photoelectric conversion element, an electric signal (interference signal) obtained by subjecting the interference light of the two components to photoelectric conversion in the photoelectric conversion element is presented to a signal processing system (not shown), and the distance (position of the moving mirror 22 in the Y-direction) between the fixed mirror 23 and the moving mirror 22 in the Y-axis direction is sensed by this signal processing system in the same manner as above.

It can be seen that the total length of the optical path for the measurement beam in the Y-interferometer of this embodiment contains the length of the optical path of the reference beam in its entirety, and the difference between the two is double the length of the optical path between the fixed mirror and the moving mirror. Specifically, it can be seen that the variations in the interference effect sensed by the detector during the movement of the moving mirror express variations in the length of the optical path between the fixed mirror and the moving mirror, and show changes in the position of the moving mirror in the Y-direction.

This embodiment also entails providing a beam-splitting interferometer for measuring the position of the beam splitter stage 6 in the X-axis direction. Similar to the above-described X-interferometer, this beam-splitting interferometer comprises a laser head 30, a polarizing beam splitter 31, a moving mirror 32, a fixed mirror 33, ¼ λ plates 34 and 35, a receiver 36, and other components, which are shown in FIG. 1. As with the above-described X-interferometer, the X-position of the moving mirror 32, which is fixed to the beam splitter stage 6, is ultimately sensed by a signal processing system. The position of the beam splitter stage 6 can therefore be controlled when the splitter is moved in the X-direction.

In the Y-interferometer described with reference to the present embodiment, the beam splitter 21 is disposed in the optical path of the measurement beam between the moving mirror 22 and the fixed mirror 23. Consequently, shifting the beam splitter 21 somewhat in the Y-direction has no effect on the length of the optical path between the moving mirror 22 and the fixed mirror 23 passing through the beam splitter 21. As described above, what is measured with the Y-interferometer is the length of the optical path for the light-irradiated points on the moving mirror 22 and the fixed mirror 23. The length of the aforementioned optical path, that is, the position of the moving mirror in the Y-direction, changes with the movement of the stage, that is, the moving mirror attached thereto, in the X-direction. In the present embodiment, therefore, the movement (movement accuracy) of the beam splitter stage 6 has no effect on the changes in the position of the moving mirror in the Y-direction being measured.

The signal processing system can be configured using an amplifier, an A/D converter, a microprocessor, or the like (none of which are shown in the drawings).

Following is a description of a method for driving the mask stage 4 and the beam splitter stage 6 during scanning and exposure in the scanning exposure apparatus 100 of the first embodiment thus configured. It is assumed in this case that 2 L is the movement stroke of the mask stage 4 in the scanning direction and that the length L1 of the moving mirror 22 and the length L2 of the fixed mirror 23 each constitute length (L+α), where α is a prescribed margin, an infinitesimally small amount in actual terms. The operation of the plate stage side is the same as that of the mask stage side, and will therefore be omitted from the description.

Figure 3:
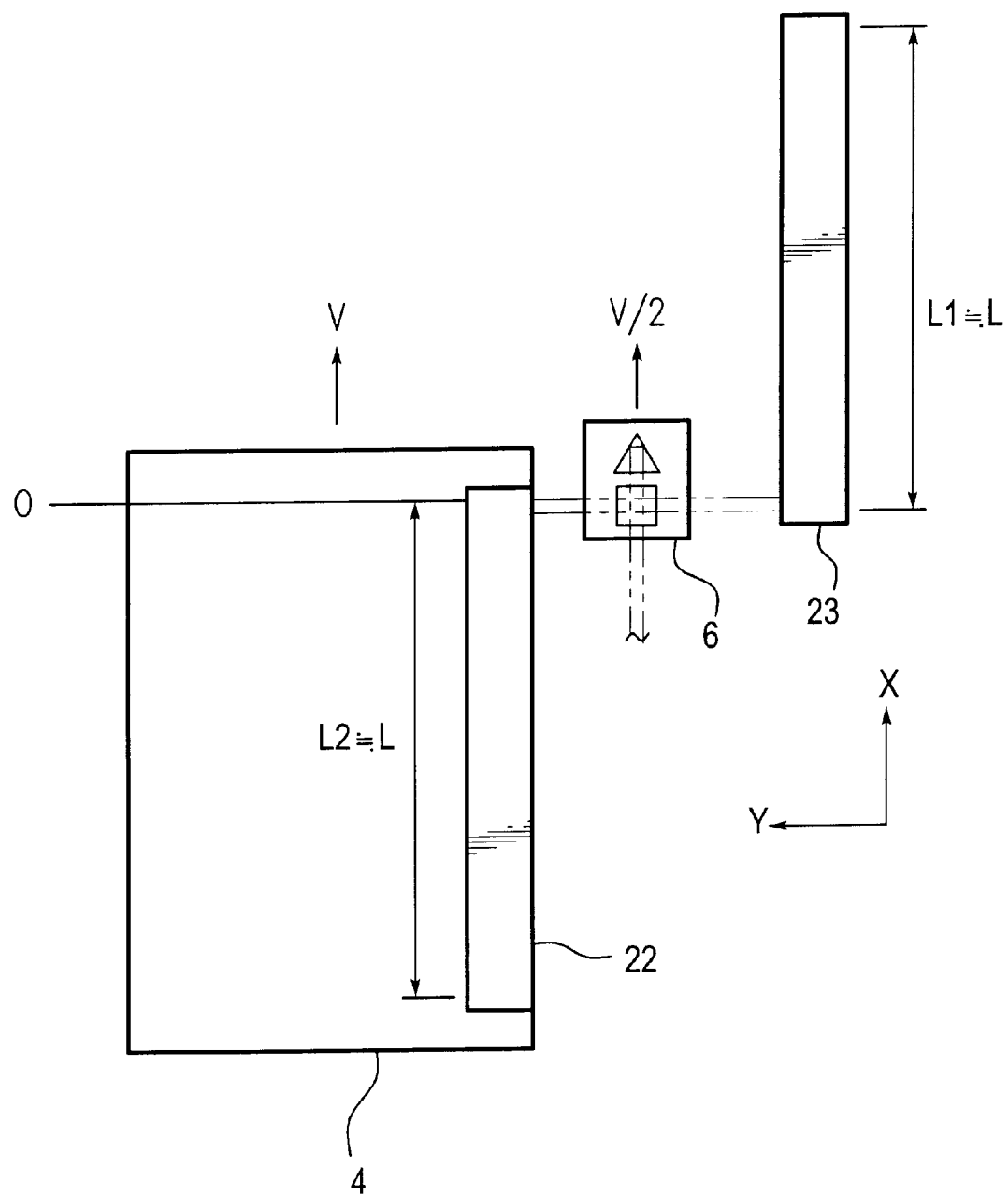
FIG. 3 is a diagram depicting the positional relation existing between the mask stage and the beam splitter stage when scanning is started.
Figure 4:
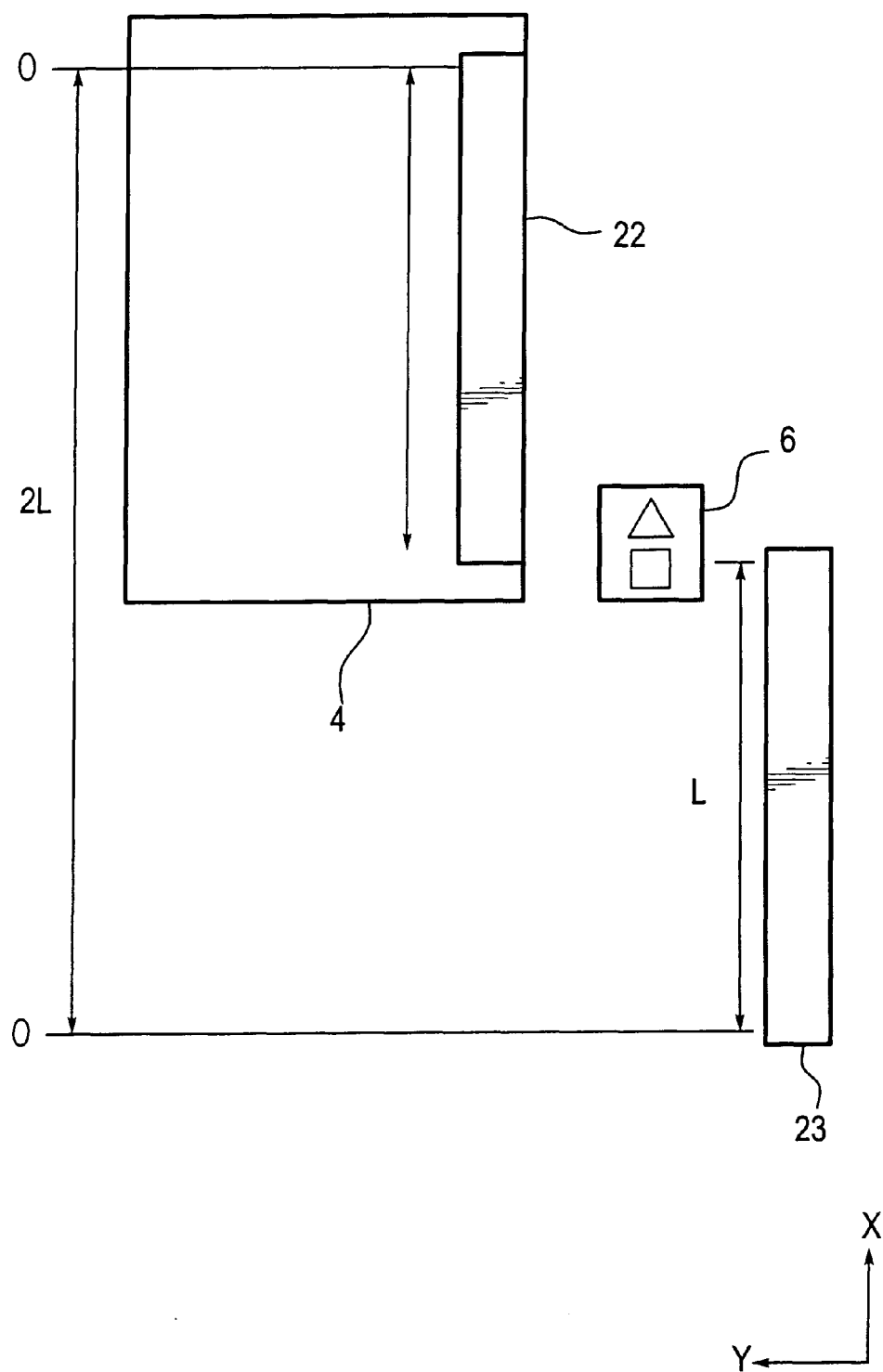
FIG. 4 is a diagram depicting the positional relation existing between the mask stage and the beam splitter stage when scanning is ended.

FIG. 3 depicts the positional relation existing between the mask stage 4 and the beam splitter stage 6 when scanning is started. From the state in FIG. 3, a control apparatus (not shown) starts to move a carriage (not shown) with the mounted mask stage 4 and plate stage 5 in the +X direction at speed V, and starts to move the beam splitter stage 6 in the +X direction at speed V/2. The scanning is completed after a prescribed time t has elapsed, such that the positional relation between the mask stage 4 and the beam splitter stage 6 at the end of scanning is such as shown in FIG. 4.

In this case, the distance traveled by the mask stage 4 is clearly 2 L, and the travel time thereof is t=2 L/V. The distance traveled by the beam splitter stage 6 during this time t is V/2×t=L. It is therefore apparent from FIGS. 3 and 4 that the present embodiment allows the measurement beam of the Y-interferometer to continue to strike the moving mirror 22 and the fixed mirror 23 from the scanning start position to the scanning end position, making it possible to sense positions in the non-scanning direction (Y-axis direction) with high accuracy over the entire scanning range (range of stroke 2 L) of the mask stage 4, whose length exceeds the entire length of the mask stage 4, by making use of a moving mirror 22 and fixed mirror 23 whose length (approximately L) is less than the entire length of the mask stage 4. An identical situation is achieved with the plate stage 5, namely, positions in the non-scanning direction (Y-axis direction) can be sensed with high accuracy over the entire scanning range of the stroke 2 L.

As noted above, positions in the Y-axis direction, which is orthogonal to the X-axis direction of the mask stage 4 and the plate stage 5, can be measured with high accuracy with the aid of the Y-interferometer of the present embodiment by employing a reference mirror (moving mirror 22 and fixed mirror 23; moving mirror 22' an fixed mirror 23') whose length is approximately half its movement stroke (2 L) and which is shorter than the mask stage 4 or plate stage 5 in the X-axis direction.

With the exposure apparatus 100 of the present embodiment, therefore, the position of the mask stage 4 or plate stage 5 in the non-scanning direction can be sensed with high accuracy even when the plate 3 (substrate) has large dimensions. In addition, the position of the mask stage 4 or plate stage 5 in the scanning direction can be sensed with high accuracy in the same manner as in the past by irradiating the miniature moving mirror 12 or 12' with an interferometer beam in the scanning direction. It is therefore possible to control the positions of the mask stage 2 and the plate 3 with high accuracy and to ultimately achieve a highly accurate superposition for the mask and the substrate.

Although it is assumed with respect to the above-described embodiment that the moving mirror on the mask side and the plate side both have a length of about L in the scanning direction of the fixed mirror, it is apparent that the present invention is not limited to this value. The mask stage 4 and the plate stage 5 may, for example, be scanned in the scanning direction at a stroke of approximately (L1+L2) by setting the scanning speed of the beam splitter stage 6 (6') to approximately L2/(L1+L2)×V in relation to the scanning speed V1 of the mask stage 4 and the plate stage 5 when the length of the moving mirrors on the mask side and the plate side is approximately L1, and the length of the fixed mirrors on the mask side and the plate side is approximately L2.

Furthermore, although the above embodiment was described with reference to a case in which the mask stage 4 and the plate stage 5 were mounted on a U-shaped carriage and moved as a unitary arrangement, it is apparent that this is not the only option and that the mask stage and the plate stage can move independently from each other in the scanning direction.

Moreover, although the above embodiment was described with reference to a double-pass interferometer in which a Y-interferometer alone was used as the corner cube, it is apparent that an X-interferometer or a beam-splitting interferometer may be constructed as a double-pass arrangement in the same manner, in which case these interferometers can yield highly accurate position measurements in the same manner as a Y-interferometer even when the measurement object generates rotational errors.

Second Embodiment

A second embodiment of the present invention will now be described with reference to FIG. 5. Here, the same numerals will be used for the components that are identical or similar to those described with reference to the first embodiment above, and their description will therefore be simplified or omitted.

The only difference of the second embodiment from the first embodiment is the structure of the Y-interferometer for measuring the positions of the mask stage and the plate stage in the non-scanning direction, with the structures of all other portions being identical. The Y-interferometer alone will therefore be described. In this embodiment, the plate-side interferometer has the same structure as the mask-side interferometer and will therefore be omitted from the detailed description.

Figure 5:
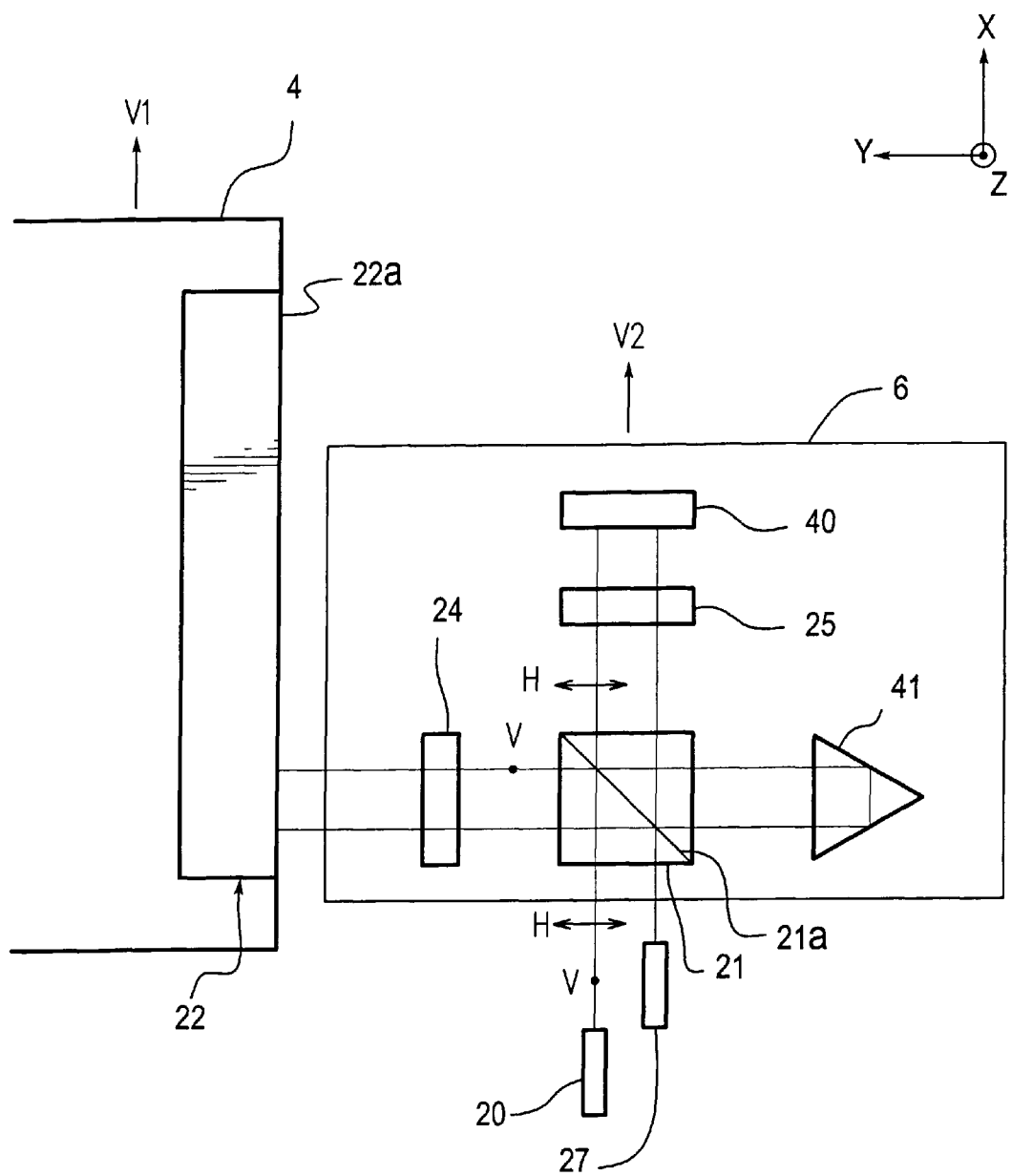
FIG. 5 is a plan view depicting the structure of the Y-interferometer pertaining to a second embodiment.

FIG. 5 schematically depicts the structure of the mask-side Y-interferometer pertaining to the second embodiment.

The Y-interferometer comprises a laser head 20 (light source unit), a polarizing beam splitter 21 (separating optical system), a moving mirror 22, ¼ λ plates 24 and 25, a mirror 40, a corner cube 41, a receiver 27, and the like.

The mirror 40, which constitutes a reference mirror, is fixed to a beam splitter stage 6 to achieve a prescribed positional relation with the polarizing beam splitter 21, the ¼ λ plates 24 and 25, and the corner cube 41.

The operation of the components of the Y-interferometer will now be described. Laser light emitted by the laser head 20 is directed toward the polarizing beam splitter 21, and the laser light incident thereon is separated by a light-separating surface 21a into an H-component (linearly polarized light whose oscillation direction is parallel to the plane of paper in FIG. 5; in this case it corresponds to a reference beam) and a V-component (linearly polarized light whose oscillation direction is perpendicular to the plane of paper in FIG. 5; in this case it corresponds to a measurement beam).

The reference beam transmitted by the light-separating surface 21a is transmitted by the ¼ λ plate 25, reflected by the mirror 40, and retransmitted by the ¼ λ plate 25. The polarization direction of the reference beam is thereby converted to a direction (that is, the same polarization direction as that of the V-component) orthogonal to the initial direction of incidence of light on the ¼-wave plate 25, and the beam is reflected by the polarizing beam splitter 21 and directed toward the corner cube 41. The reference beam is bent back by the corner cube 41 along an optical path parallel to the path of incident light, reflected again by the polarizing beam splitter 21, transmitted by the ¼ λ plate 25, and reflected by the mirror 40. The reference beam is retransmitted by the ¼ λ plate 25, and the polarization direction thereof is converted (to the same polarization direction as that of the H-component). The beam is transmitted by the polarizing beam splitter 21 and directed toward the receiver 27.

Meanwhile, the measurement beam (V-component) reflected by the light-separating surface 21a is transmitted by the ¼ λ plate 24, converted to circularly polarized light, reflected by the reflecting surface 22a of the moving mirror 22, and retransmitted by the ¼ λ plate 24. The polarization direction of the measurement beam is thereby converted by the ¼ λ plate 24, and the beam is transmitted by the polarizing beam splitter 21 and directed toward the corner cube 41. The measurement beam is bent back by the corner cube 41 along an optical path parallel to the path of incident light, retransmitted by the polarizing beam splitter 21 and the ¼ λ plate 24, and converted to circularly polarized light. The measurement beam is reflected by the reflecting surface 22a of the moving mirror 22 and transmitted by the ¼ λ plate 24. The polarization direction thereof is converted to a direction opposite the initial direction of incidence of light on the ¼ λ plate 24, and the beam is reflected by the polarizing beam splitter 21, coaxially superposed with the reference beam, transmitted along the same optical path, and admitted by the receiver 27.

In the receiver 27, the interference light of the vector constituents of two components corresponding to prescribed modified components is presented to a photoelectric conversion element in the manner described above, an electric signal (interference signal) obtained by subjecting the interference light of the two components to photoelectric conversion in the photoelectric conversion element is presented to a signal processing system (not shown), and the position of the moving mirror 22 in the Y-axis direction is sensed by this signal processing system.

The exposure apparatus of the second embodiment equipped with the Y-interferometer thus configured has no limitations in terms of length because of the absence of a fixed mirror, making it possible to measure the position of the mask stage 4 in the non-scanning direction.

In this case, the measurement beam continuously strikes a different position on the reflecting surface 22a of the moving mirror 22, allowing the position of the mask stage 4 in the Y-axis direction to be measured as long as the following expression is satisfied: $S=|V1/(V1-V2)|L1>L1$, or $0<V2<2V1$ ($V1 \neq V2$), where L1 is the length of the moving mirror 22; V1 is the speed of the mask stage 4; V2 is the speed of the beam splitter stage 6; and S is the movement stroke (stroke length) of the mask stage 4 in the X-axis direction.

For example, $S=2L1$ when $V2=V½$. In addition, $S=10L1$ when $V2=9/10 \times V1$.

Figure 6:
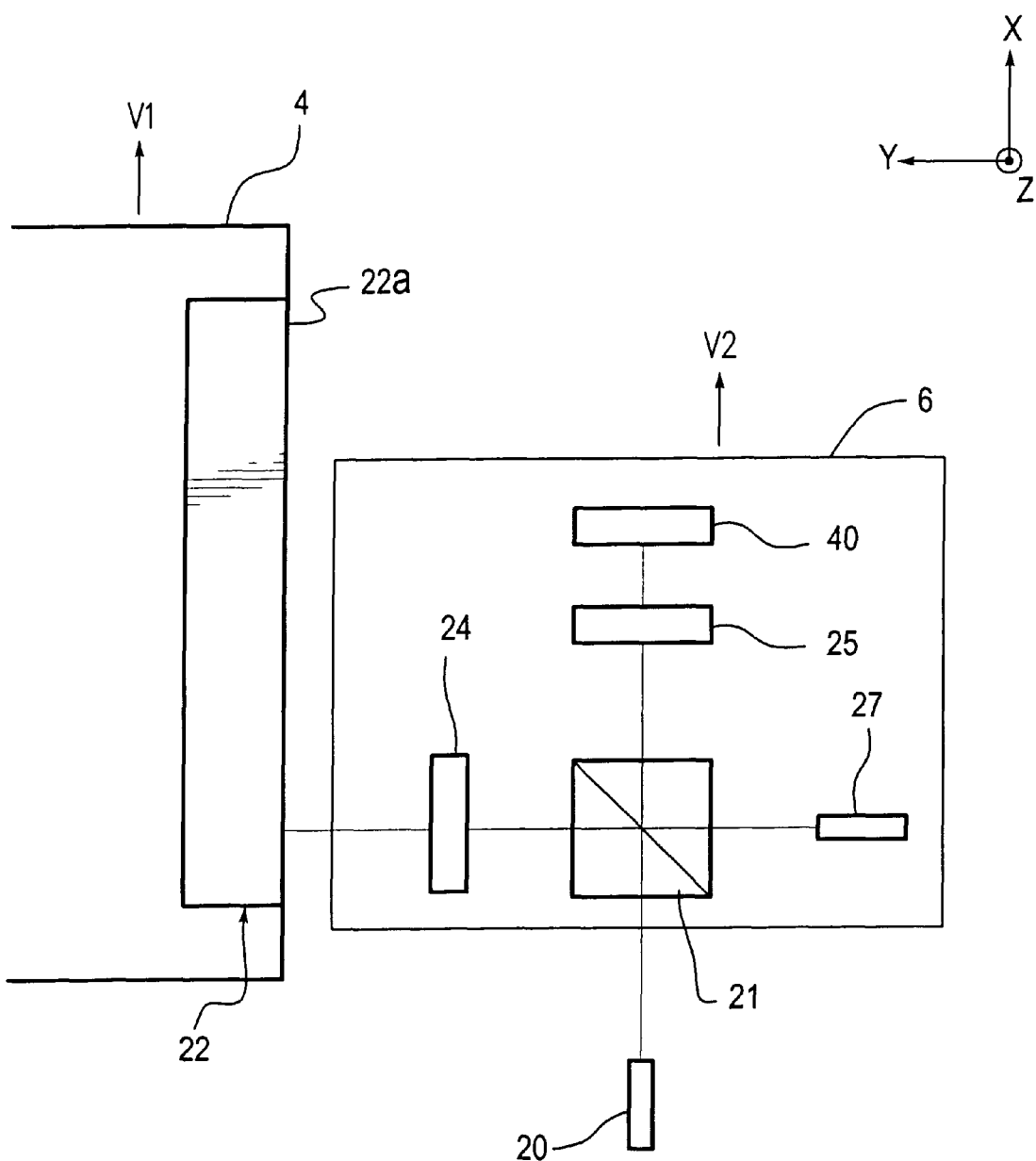
FIG. 6 is a plan view depicting the structure of the Y-interferometer pertaining to another embodiment.

Although the first and second embodiments above were described with reference to double-pass interferometers obtained by equipping Y-interferometers with corner cubes, this is not the only option, and a single-pass construction may be adopted in the case of a structure in which the mask stage or other measurement object is substantially free of rotation during scanning. FIG. 6 depicts an example of an interferometer used in the case of a structure in which the Y-interferometer pertaining to the above-described second embodiment is configured as a single-pass structure. In the interferometer in FIG. 6, a receiver 27 is fixed on the beam splitter stage 6 instead of the corner cube 41 in FIG. 5. The laser interferometer in FIG. 6 is capable of demonstrating the same effect as that achieved in the above-described second embodiment. It is also possible to adopt an arrangement in which, instead of the receiver 27 in FIG. 6, a reflecting mirror is fixed on the beam splitter stage 6 at an angle of 45 degrees in the X-axis direction, and the receiver 27 is disposed along the path of light reflected from the reflecting mirror.

Although the first embodiment above was described with reference to a case in which the moving mirror 22 and the fixed mirror 23 were disposed facing each other in the same horizontal plane, possible arrangements are not limited to this embodiment alone and may include cases in which the moving mirror 22 and a fixed mirror 42 constituting a reference mirror are disposed parallel to each other at different height positions, as shown, for example, in FIG. 7. In the interferometer in FIG. 7, the fixed mirror 42 may, for example, be mounted on the tubular mirror of the projection optical system. In addition, a semitransparent mirror 44 may be fixed at an angle of 45 degrees in the XZ plane on the beam splitter stage 6 that supports the polarizing beam splitter 21. Furthermore, a totally reflecting mirror 45 for reflecting in the direction of the moving mirror 22 the V-component reflected by the polarizing beam splitter 21 may be disposed along the path of light reflected by the polarizing beam splitter 21. This totally reflecting mirror 45 can move in the X-axis direction as a unitary structure together with the semitransparent mirror 44 and the polarizing beam splitter 21 on the beam splitter stage 6.

Figure 7:
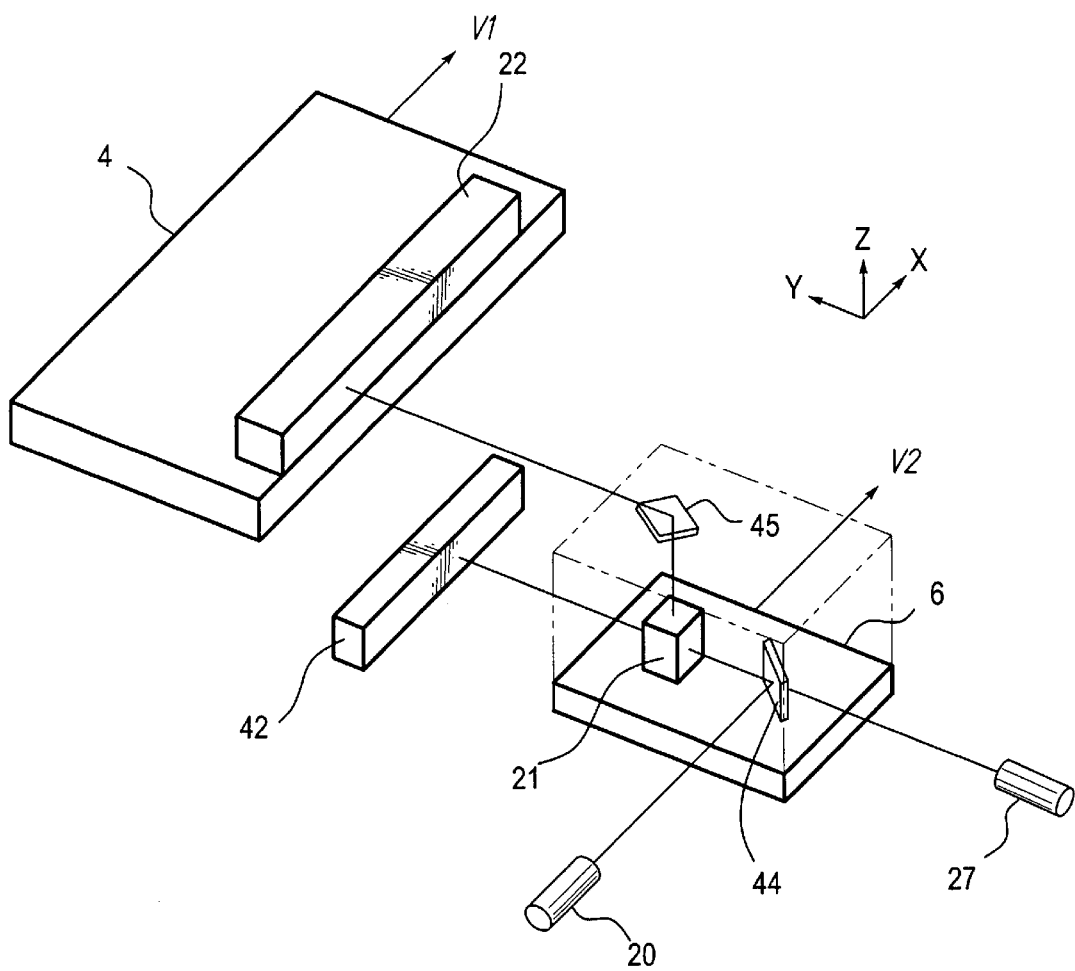
FIG. 7 is a perspective view depicting the structure of the Y-interferometer pertaining to another embodiment.
Figure 8:
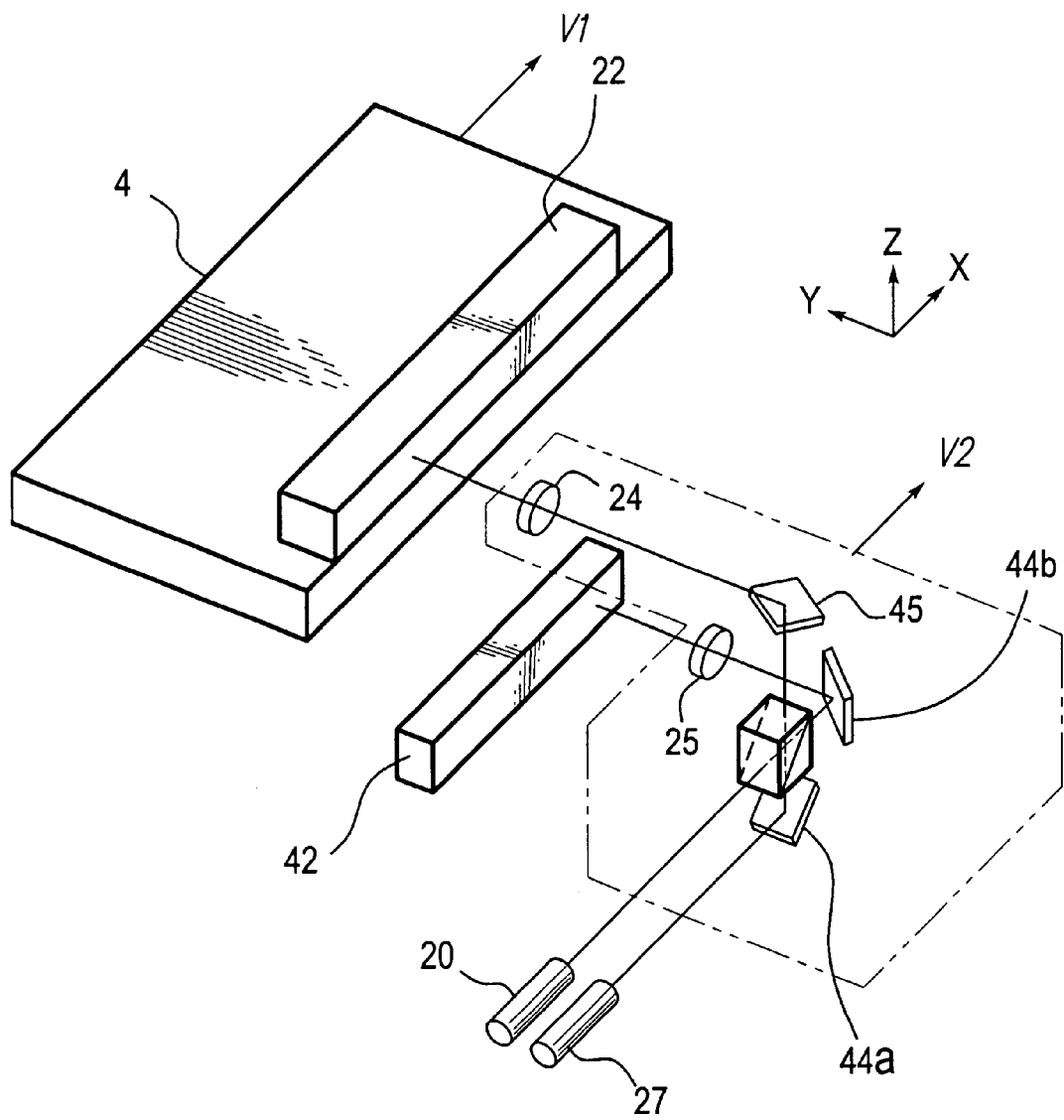
FIG. 8 is a perspective view depicting a modification of the Y-interferometer in FIG. 7.

FIG. 8 depicts a modification of FIG. 7. The structural example shown in FIG. 8 differs from the specific example shown in FIG. 7 in that reflecting mirrors 44a and 44b are used, the position of the receiver 42 is changed, and ¼-wave plates 24 and 25 are used. The entire optical system enclosed within the dashed line is mounted on a movable member such as a stage (not shown), and the system is moved at V2 (for example, V/2) relative to the speed V1 of the movable stage.

Integrating the laser interferometer in FIG. 7 or 8 into an exposure apparatus can still yield the same effect as that obtained in the first embodiment described above.

The embodiments have been described above with reference to cases in which the laser interferometer according to the present invention was used in scanning exposure apparatus designed for manufacturing liquid crystal display panels. However, the interferometer is not limited to the exposure apparatus, and may be appropriately employed in scanning steppers of the step-and-scan type used in manufacturing semiconductor substrates, proximity aligners and other types of exposure apparatus, and any types of apparatus provided with unidimensionally movable stages. The interferometer according to the present invention may be also used for an exposure apparatus which is suitable for manufacturing liquid crystal display panels and has a plurality of projection optical systems (multi-lenses). Further, the substrate to be exposed may be not only the liquid crystal display panel, but a glass substrate on which a mask pattern is formed through photo-lithography by the exposure apparatus.

Another feature is that even when it is used in an XY two-dimensional movable stage, the laser interferometer in accordance with the present invention is capable of detecting with high accuracy the position of the stage in a direction orthogonal to the long stroke direction across the entire region of a stroke that is longer the total length of the stage, using a reflecting mirror that is shorter than the total length of the stage. In this sense, the interferometer is useful as an apparatus for measuring the position of a stepper or other wafer stage.

As noted above, the laser interferometer, position measuring apparatus, and position measuring method according to the present invention are highly effective in allowing the position of a moving object to be measured in a direction orthogonal to the long stroke direction across the entire region of a movement stroke in excess of the total length of the moving object, using a reflecting mirror that is shorter than the total length of the moving object. In addition, the exposure apparatus in accordance with the present invention allows the position of a stage to be controlled with high accuracy even when a bulky substrate is used. The manufacturing method of the present invention is a useful method for manufacturing the novel laser interferometer, position measuring apparatus, and exposure apparatus according to the present invention.

What is claimed is:

1. A laser interferometer for measuring, with a laser beam, the position of a moving object in a first direction orthogonal to a second direction when the object moves in the second direction, the laser interferometer comprising:
   a separating optical system for separating the laser beam into a measurement beam and a reference beam;
   a moving mirror which is attached to the moving object and reflects the measurement beam;
   a reference mirror which is provided independently from the moving object and reflects the reference beam;
   a moving device for moving the separating optical system in the second direction at a speed different from a speed of the moving object; and
   a detector for detecting the measurement beam reflected from the moving mirror and the reference beam reflected from the reference mirror, and determining the position of the moving object in the first direction on the basis of interference effect of the beams.

2. The laser interferometer according to claim 1, wherein the moving device moves the reference mirror together with the separating optical system.

3. The laser interferometer according to claim 1, wherein a fixed mirror is further provided, and the fixed mirror is disposed such that the measurement beam passes between the moving mirror and the fixed mirror.

4. The laser interferometer according to claim 1, wherein the speed of the separating optical system is lower than the speed of the moving mirror.

5. The laser interferometer according to claim 3, wherein the moving mirror has a reflecting surface that extends over length L1 in the second direction; the fixed mirror has a reflecting surface that extends over length L2 in the second direction; and the following relation is satisfied $(L1+L2)/V1=L2/V2$, where V1 is the speed of the moving object in the second direction, and V2 is the speed of the separating optical system in the second direction.

6. The laser interferometer according to claim 1, wherein the separating optical system is a beam splitter, and the measurement beam and the reference beam are, respectively, p-polarized light and s-polarized light separated by the beam splitter.

7. The laser interferometer according to claim 1, wherein the reference mirror comprises a corner cube.

8. A position measuring apparatus for measuring, with a light from a light source, the position of a moving object in a first direction orthogonal to a second direction when the object moves in the second direction, the position measuring apparatus comprising:

a separating optical system for separating the light from the light source into a measurement beam and a reference beam;

a moving mirror which is attached to the moving object and reflects the measurement beam;

a fixed mirror which is provided independently from the moving object and defines part of an optical path for the measurement beam between the moving mirror and the fixed mirror;

a moving device for moving the separating optical system in the second direction at a speed different from the speed of the moving object; and a detecting system for detecting the measurement beam and reference beam and determining the position of the moving object in the first direction on the basis of interference effect of the beams.

9. The position measuring apparatus according to claim 8, further provided with a reference mirror for reflecting the reference beam toward the detecting system.

10. The position measuring apparatus according to claim 9, wherein the reference mirror is disposed facing the detecting system such that the separating optical system is sandwiched therebetween.

11. The position measuring apparatus according to claim 10, wherein the fixed mirror is disposed facing the moving mirror such that the separating optical system is sandwiched therebetween.

12. The position measuring apparatus according to claim 11, wherein variations in the length of the optical path between the moving mirror and the fixed mirror are determined by the detecting system during the movement of the moving object.

13. The position measuring apparatus according to claim 8, wherein the speed of the separating optical system is lower than the speed of the moving mirror.

14. The position measuring apparatus according to claim 8, wherein the moving mirror has a reflecting surface that extends over length L1 in the second direction; the fixed mirror has a reflecting surface that extends over length L2 in the second direction; and the following relation is satisfied: $(L1+L2)/V1=L2/V2$, where V1 is the speed of the moving object in the second direction, and V2 is the speed of the separating optical system in the second direction.

15. The position measuring apparatus according to claim 8, wherein the separating optical system is a beam splitter, and the measurement beam and the reference beam are, respectively, s-polarized light and p-polarized light separated by the beam splitter.

16. The position measuring apparatus according to claim 9, wherein the moving device is a moving stage on which the separating optical system is disposed, and a reference mirror is disposed on the moving stage.

17. The position measuring apparatus according to claim 8, further comprising phase-adjusting optical systems which are provided between the moving mirror and the separating optical system, and between the fixed mirror and the separating optical system, respectively.

18. The position measuring apparatus according to claim 8, wherein the moving mirror is provided so as to be extended in the first direction.

19. An exposure apparatus for transferring a pattern formed on a mask onto a substrate, the exposure apparatus comprising:

a mask stage for holding the mask thereon and moving the mask in a second direction;

a substrate stage for holding the substrate thereon and moving the substrate in the second direction; and a laser interferometer for measuring with a laser beam the position of at least one of the stages in a first direction orthogonal to the second direction; the laser interferometer including:

a separating optical system for separating the laser beam into a measurement beam and a reference beam;

a moving mirror which is attached to at least one of the stages and reflects the measurement beam;

a reference mirror which is provided independently from at least one of the stages and reflects the reference beam;

a moving device for moving the separating optical system in the second direction at a speed different from the speed of the at least one of the stages; and a detector for detecting the measurement beam reflected from the moving mirror and the reference beam reflected from the reference mirror, and determining the position of the at least one of the stages in the first direction on the basis of interference effect of the beams.

20. The exposure apparatus according to claim 19, wherein the moving device moves the reference mirror together with the separating optical system.

21. The exposure apparatus according to claim 19, further comprising a fixed mirror, wherein the fixed mirror is disposed such that the measurement beam passes between the moving mirror and the fixed mirror.

22. The exposure apparatus according to claim 21, wherein the moving mirror has a reflecting surface that extends over length L1 in the second direction; the fixed mirror has a reflecting surface that extends over length L2 in the second direction; and the following relation is satisfied: $(L1+L2)/V1=L2/V2$, where V1 is the speed of at least one of the stages in the second direction, and V2 is the speed of the separating optical system in the second direction.

23. The exposure apparatus according to claim 19, wherein the separating optical system is a beam splitter, and the measurement beam and the reference beam are, respectively, s-polarized light and p-polarized light separated by the beam splitter.

24. The exposure apparatus according to claim 19, wherein the reference mirror comprises a corner cube.

25. The exposure apparatus according to claim 19, wherein the moving mirror has a first moving mirror, which is mounted on the mask stage, and a second moving mirror, which is mounted on the substrate stage.

26. The exposure apparatus according to claim 19, further comprising a projection optical system and a carriage for mounting the mask stage and the substrate stage, the carriage being used to move the mask stage and the substrate stage relative to the projection optical system.

27. An exposure apparatus for transferring a pattern formed on a mask onto a substrate, the exposure apparatus comprising:

a mask stage for holding the mask and moving the mask in a second direction;

a substrate stage for holding the substrate and moving the substrate in the second direction; and a position measuring apparatus for measuring with a light beam the position of at least one of the stages in a first direction orthogonal to the second direction; the position measuring apparatus including:

a separating optical system for separating the light beam into a measurement beam and a reference beam;

a moving mirror which is attached to the at least one of the stages and reflects the measurement beam;

a fixed mirror which is provided independently from the at least one of the stages and defines part of an optical path for the measurement beam between the moving mirror and the fixed mirror;

a moving device for moving the separating optical system in the second direction at a speed different from the speed of the at least one of the stages; and a detecting system for detecting the measurement beam and reference beam and determining the position of the at least one of the stages in the first direction on the basis of interference effect of the beams.

28. The exposure apparatus according to claim 27, further comprising a reference mirror for reflecting the reference beam toward the detecting system.

29. The exposure apparatus according to claim 28, wherein the reference mirror is disposed facing the detecting system such that the separating optical system is sandwiched therebetween.

30. The exposure apparatus according to claim 29, wherein the fixed mirror is disposed facing the moving mirror such that the separating optical system is sandwiched therebetween.

31. The exposure apparatus according to claim 27, wherein variations in the length of the optical path between the moving mirror and the fixed mirror are determined by the detecting system during the movement of at least one of the stages.

32. The exposure apparatus according to claim 27, wherein the moving mirror has a reflecting surface that extends over length L1 in the second direction; the fixed mirror has a reflecting surface that extends over length L2 in the second direction; and the following relation is satisfied: (L1+L2)/V1=L2/V2, where V1 is the speed of at least one of the stages in the second direction, and V2 is the speed of the separating optical system in the second direction.

33. The exposure apparatus according to claim 27, wherein the separating optical system comprises a beam splitter, and the measurement beam and the reference beam are, respectively, s-polarized light and p-polarized light separated by the beam splitter.

34. The exposure apparatus according to claim 28, wherein the moving device is a moving stage on which the separating optical system is disposed, and a reference mirror is disposed on the moving stage.

35. The exposure apparatus according to claim 27, further comprising phase-adjusting optical systems which are provided between the moving mirror and the separating optical system, and between the fixed mirror and the separating optical system, respectively.

36. The exposure apparatus according to claim 27, wherein the moving mirror has a first moving mirror, which is mounted on the mask stage, and a second moving mirror, which is mounted on the substrate stage.

37. The exposure apparatus according to claim 27, further comprising a projection optical system and a carriage for mounting the mask stage and the substrate stage, the carriage being used to move the mask stage and the substrate stage relative to the projection optical system.

38. A position measuring method for measuring a position of a moving object in a first direction orthogonal to a second direction based on interference effect by directing a laser beam toward a fixed mirror and a moving mirror attached to the moving object which travels in the second direction, the method comprising the steps of:

separating the laser beam into a measurement beam and a reference beam;

directing the measurement beam toward the moving mirror while moving the measurement beam in the second direction at a speed different from that of the moving object being moved, and passing the light reflected from the moving mirror between the moving mirror and the fixed mirror; and determining the position of the moving object in the first direction by comparing the phase of the reference beam and the phase of the measurement beam passed between the moving mirror and the fixed mirror.

39. The measuring method according to claim 38, wherein the optical path of the measurement beam comprises the optical path of the reference beam.

40. The measuring method according to claim 38, wherein the moving mirror has a reflecting surface that extends over length L1 in the second direction; the fixed mirror has a reflecting surface that extends over length L2 in the second direction; and the following relation is satisfied: (L1+L2)/V1=L2/V2, where V1 is the speed of the moving object in the second direction, and V2 is the speed of the separating optical system in the second direction.

41. The measuring method according to claim 38, wherein the measurement beam is moved in the second direction at the speed different from that of the moving object by moving the beam splitter which divides the laser beam into the measurement beam and the reference beam, in the second direction at a speed different from that of the moving object.

42. The measuring method according to claim 38, wherein an optical path of the measurement beam is arranged such that the measurement beam strikes the moving mirror and is reflected toward the fixed mirror, and the measurement beam and the reference beam are then combined.

43. A method for manufacturing a laser interferometer for measuring, with a laser beam, the position of a moving object in a first direction orthogonal to a second direction when the object moves in the second direction, comprising:

providing a separating optical system for separating the laser beam into a measurement beam and a reference beam;

providing, on the moving object, a moving mirror for reflecting the measurement beam;

providing a reference mirror which is provided independently from the moving object and reflects the reference beam;

providing a moving device for moving the separating optical system in the second direction at a speed different from the speed of the moving object; and providing a detector for detecting the measurement beam reflected from the moving mirror and the reference beam reflected from the reference mirror, and determining the position of the moving object in the first direction on the basis of interference effect of the beams.

44. The manufacturing method according to claim 43, wherein the moving device is a moving stage, and the separating optical system is mounted on the moving stage.

45. The manufacturing method according to claim 44, wherein the reference mirror is mounted on the moving stage.

46. The manufacturing method according to claim 43, further comprising a laser light source for directing the laser light toward the separating optical system.

47. A method for manufacturing a position measuring apparatus for measuring, with a light from a light source, the position of a moving object in a first direction orthogonal to a second direction when the object moves in the second direction, comprising:

provideng a separating optical system for separating the light from the light source into a measurement beam and a reference beam;

providing, on the moving object, a moving mirror for reflecting the measurement beam;

providing a fixed mirror which defines part of an optical path for the measurement beam between the moving mirror and the fixed mirror;

providing a moving device for moving the separating optical system in the second direction at a speed different from the speed of the moving object; and providing a detecting system for detecting the measurement beam and reference beam and determining the position of the moving object in the first direction on the basis of interference effect of the beams.

48. The manufacturing method according to claim 47, further comprising providing a reference mirror for reflecting the reference beam toward the detecting system.

49. The manufacturing method according to claim 48, wherein the reference mirror is disposed facing the detecting system such that the separating optical system is sandwiched therebetween.

50. The manufacturing method according to claim 49, wherein the fixed mirror is disposed facing the moving mirror such that the separating optical system is sandwiched therebetween.

51. A method for manufacturing an exposure apparatus for transferring a pattern formed on a mask onto a substrate, comprising:

providing a mask stage for holding the mask and moving the mask in a second direction;

providing a substrate stage for holding the substrate and moving the substrate in the second direction;

providing a separating optical system for separating a laser beam into a measurement beam and a reference beam;

providing on at least one of the mask stage and the substrate stage a moving mirror for reflecting the measurement beam;

providing a reference mirror for reflecting the reference beam;

providing a moving device for moving the separating optical system in the second direction at a speed different from the speed of the at least one of the stages; and providing a detector for detecting the measurement beam reflected from the moving mirror and the reference beam reflected from the reference mirror, and determining the position of the at least one of the stages in the first direction on the basis of interference effect of the beams.

52. The manufacturing method according to claim 51, further comprising providing a fixed mirror such that the measurement beam is passed between the moving mirror and the fixed mirror.

53. A method for manufacturing an exposure apparatus for transferring a pattern formed on a mask onto a substrate, the manufacturing method comprising:

providing a mask stage for holding the mask and moving the mask in a second direction;

providing a substrate stage for holding the substrate and moving the substrate in the second direction;

providing a separating optical system for separating the light into a measurement beam and a reference beam;

providing on at least one of the mask stage and the substrate stage a moving mirror for reflecting the measurement beam;

providing a fixed mirror which defines part of an optical path for the measurement beam between the moving mirror and the fixed mirror;

providing a moving device for moving the separating optical system in the second direction at a speed different from the speed of the at least one of the stages; and providing a detecting system for detecting the measurement beam and reference beam and determining the position of the at least one of the stages in the first direction on the basis of interference effect of the beams.

54. The manufacturing method according to claim 53, further comprising providing with a reference mirror for reflecting the reference beam toward the detecting system.

55. The manufacturing method according to claim 54, wherein the reference mirror is disposed facing the detecting system such that the separating optical system is sandwiched therebetween.

56. The manufacturing method according to claim 55, wherein the fixed mirror is disposed facing the moving mirror such that the separating optical system is sandwiched therebetween.

57. A position measuring apparatus for measuring, with a laser beam from a light source, a position of a moving object in a first direction orthogonal to a second direction when the object moves in the second direction, the position measuring apparatus comprising:

a moving mirror attached to the moving object, and a fixed mirror provided independently from the moving object;

an optical system for splitting the light beam from the light source and directing the split beams individually toward the moving mirror and the fixed mirror;

a moving device for moving the optical system in the second direction at a speed different from the speed of the moving object; and a detector for detecting the light beams reflected from the moving mirror and the fixed mirror, and determining the position of the moving object in the first direction on the basis of interference effect of the beams.

* * * * *

UNITED STATES PATENT AND TRADEMARK OFFICE
CERTIFICATE OF CORRECTION

PATENT NO. : 6,211,965 B1
DATED : April 3, 2001
INVENTOR(S) : Makoto Tsuchiya et al.

It is certified that error appears in the above-identified patent and that said Letters Patent is hereby corrected as shown below:

Title page,
Please change the Title as follows:
Change "PHOTOLITHOGRAPHIC POSITION MEASURING LASER INTERFEROMETER WITH RELITIVELY MOVING MEASURING INTEREOMETER" to -- LASER INTERFEROMETER, POSITION MEASURING APPARATUS AND MEASURING METHOD, EXPOSURE APPARATUS, AND METHOD FOR MANUFACTURING THESE --.

Signed and Sealed this

Twenty-sixth Day of March, 2002

*Attest:*

*Attesting Officer*

JAMES E. ROGAN
*Director of the United States Patent and Trademark Office*